United States Patent [19]

Aschwanden et al.

[11] 4,443,769
[45] Apr. 17, 1984

[54] FREQUENCY SEARCH SYSTEM FOR A PHASE LOCKED LOOP

[75] Inventors: Felix Aschwanden, Thalwil; Willem H. Groeneweg, Affoltern, both of Switzerland

[73] Assignee: RCA Corporation, New York, N.Y.

[21] Appl. No.: 304,163

[22] Filed: Sep. 21, 1981

[30] Foreign Application Priority Data

Apr. 27, 1981 [GB] United Kingdom ................. 8112914

[51] Int. Cl.³ .......................... H03D 3/18; H03L 7/00
[52] U.S. Cl. ......................................... 329/50; 331/4; 331/14; 331/17; 331/20; 358/25; 455/260
[58] Field of Search .................... 331/4, 14, 17, 20, 23, 331/25; 329/50; 455/260; 358/23, 24, 25

[56] References Cited

U.S. PATENT DOCUMENTS

| | | | |
|---|---|---|---|
| 3,775,695 | 11/1973 | Hill | 331/4 |
| 4,115,745 | 9/1978 | Egan . | |
| 4,117,420 | 9/1978 | DeConinck et al. | 331/14 X |
| 4,146,843 | 3/1979 | Isobe | 329/50 |
| 4,222,074 | 9/1980 | Breithaupt . | |
| 4,291,336 | 9/1981 | Shanley | 358/25 X |

FOREIGN PATENT DOCUMENTS

WO79/905 of 1979 PCT Int'l Appl. .

| | | |
|---|---|---|
| 2050731 | of 0000 | United Kingdom . |
| 2043373 | of 0000 | United Kingdom . |
| 2008347 | of 0000 | United Kingdom . |
| 1509913 | of 0000 | United Kingdom . |
| 1272447 | of 0000 | United Kingdom . |
| 655553 | of 0000 | United Kingdom . |
| 641900 | of 0000 | United Kingdom . |
| 2077533 | 12/1981 | United Kingdom .................. 329/50 |

OTHER PUBLICATIONS

Anon, "Linear Integrated Circuits Data Book", Fairchild Semiconductor, 1976, pp. 9-26 and 9-37.
Hermsdörfer, O., "TV Demodulator AMF2 Now Combines Envelope and Synchronous Detection", News from Rodhe & Schwarz 77, vol. 17, pp. 9-13, 1977.

Primary Examiner—Stanley D. Miller
Assistant Examiner—W. R. Paxman
Attorney, Agent, or Firm—E. M. Whitacre; W. H. Meise; H. I. Steckler

[57] ABSTRACT

A sampling PLL circuit features a frequency sweep caused by an offset voltage applied to an integrator to avoid false lock ups. At one end of the frequency range the polarity of the offset signal can be reversed. The error voltage can be sampled during a television vertical or horizontal blanking period. Once proper lock up is achieved, the offset signal can be removed.

6 Claims, 4 Drawing Figures

FREQUENCY SEARCH SYSTEM FOR A PHASE LOCKED LOOP

BACKGROUND OF THE INVENTION

The present invention relates to phase locked loop circuits, and more particularly to such circuits with a wide lock-in range.

In the "Triax" television camera system, a single double shielded cable (triaxial cable) is used for carrying signals from the camera head (CH) to the central processing unit (CPU) and vice versa. Among several other signals, three wide band video signals containing red, green and blue information of a scene being viewed by the CH have to be transmitted to the CPU. In a particular system the method chosen to do this is frequency multiplexing, with three different crystal controlled carriers on 16.5, 28.5 and 40.5 MHz respectively. These carrier frequencies can also be chosen differently. Double sideband suppressed-carrier amplitude modulation is used.

In order to demodulate such a signal at the CPU, the carrier has to be regenerated with a phase locked loop (PLL) system having a demodulator, integrator and an inductor-capacitor (LC) voltage controlled oscillator (VCO). As a phase reference for the PLL, the video signal during certain of its intervals, such as the horizontal and vertical blanking periods, can be used. In fact, both blanking periods are used in the disclosed embodiments to generate a phase reference by sampling an error signal from the demodulator, which error signal is a sine wave when the PLL is not locked onto the carrier frequency. However, such a sampled system can sample nearly equal positive and negative portions of the sine wave when the frequency of the sine wave corresponds to the horizontal sampling frequency or a harmonic thereof. The result is little or no error voltage applied to the integrator in the PLL. Hence a frequency control voltage for the VCO derived from the integrator remains unchanged, and therefore the PLL may lock onto a sideband of the suppressed carrier, which sideband has a frequency that differs from the carrier frequency by the sampling frequency or a harmonic thereof.

Further, a wide frequency pull-in range for the PLL is necessary because of the tolerances and frequency drift of the LC VCO. A more stable crystal controlled oscillator is not possible, because at the frequencies involved, the crystals have to work at their third harmonic and can only be pulled over a very limited frequency range (maximum a few hundred hertz), which is not enough to deal with tolerance and temperature drift of the crystal oscillator in the camera head. A wide PLL pull-in range requires a small time constant in the integrator; however, a large time constant is desired for increased noise immunity.

It is therefore desirable to have a PLL that has a wide pull-in range, high noise immunity, and which avoids false lock ups.

SUMMARY OF THE INVENTION

Method and apparatus for locking a phase locked loop onto a reference signal, comprising sampling a signal varying in accordance with said reference signal, and avoiding false lock ups of said loop.

DETAILED DESCRIPTION

Figure 1:
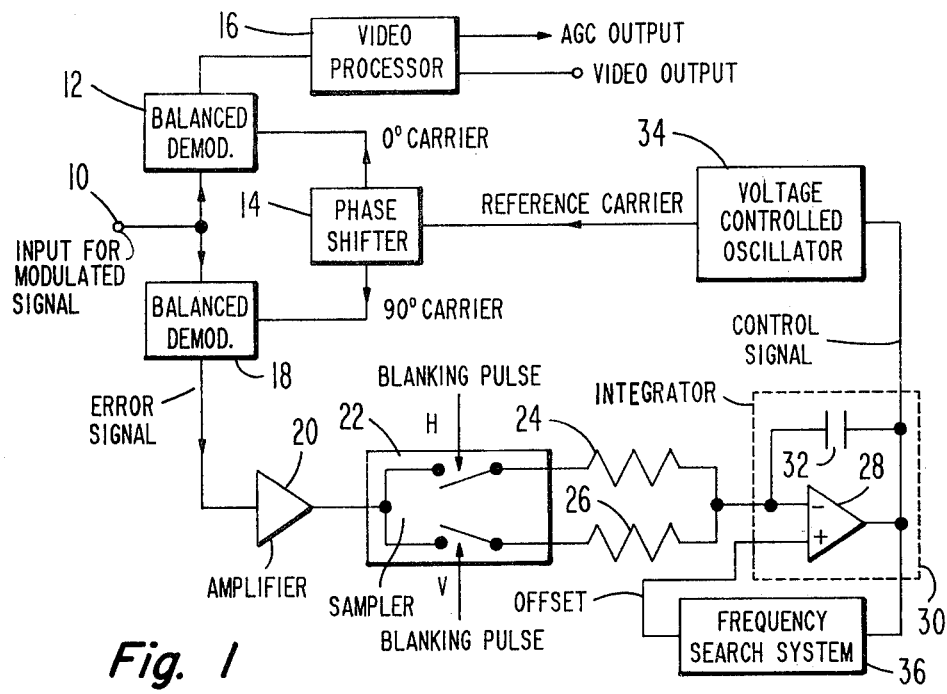
FIG. 1 shows a block diagram of a first embodiment of the invention.

FIG. 1 shows a block diagram of a first embodiment of the invention for use at the CPU.

A double sideband suppressed carrier modulated video signal is received at input terminal 10 and applied to first balanced demodulator 12 which demodulator also receives a carrier signal from phase shifter 14. The signal from shifter 14 has a phase arbitrarily called zero degrees. The video demodulated signal at the output of balanced demodulator 12 is amplified, filtered and clamped in the video processor 16. Also an automatic gain control signal is derived here.

A second balanced demodulator 18 receives a carrier signal from phase shifter 14 that has a 90 degree phase shift with respect to the phase of the carrier applied to demodulator 12. Demodulator 18 provides an error signal representing the frequency and phase differences between the suppressed carrier signal and the VCO 34 output signal, which error signal is amplified by amplifier 20. The error signal is sampled during the constant signal amplitude horizontal and vertical blanking times by a sampler 22 that receives both horizontal and vertical blanking pulses from a sync generator (not shown) that is present in the CPU.

Resistors 24 and 26 provide selected time constants (explained below) for the error signal samples occurring during horizontal and vertical intervals respectively. Thereafter, the error signal samples are fed to the inverting input of amplifier 28 of a "hold" integrator 30, which also comprises a capacitor 32. The time constant of integrator 30 with resistor 24 is about 20 milliseconds for good noise immunity. High noise immunity is important for error signal samples occurring during horizontal blanking periods, since active video occurs shortly thereafter and any error due to a noisy reference signal will cause picture jitter. The time constant of integrator 30 with resistor 26 is about 4 milliseconds. High noise immunity is not so important during vertical blanking periods, since the horizontal error signal samples occur shortly thereafter to maintain locking of the PLL. Therefore a short time constant is used to ensure a short lock up time of the PLL.

The output of integrator 30 changes the frequency of VCO 34 by use of a voltage variable capacitor (not shown) in VCO 34 in order to minimize the error signal. If the reference oscillator 34 is free-running, which can be the case after switching on the PLL or after disconnection of the incoming video signal, the frequency might be relatively far away from the nominal frequency. Sidebands or spurious signals, e.g., harmonics of the line frequency, in the input signal could upset correct locking. Either no locking is achieved or locking to a spurious frequency may occur. To prevent unwanted locking, a DC offset voltage is introduced at the non-inverting input of amplifier 28 by a frequency search system 36 in accordance with the present invention.

When locked onto a harmonic of the horizontal sampling frequency, the amplitude of the signal at the inverting input of amplifier 28 is low since nearly equal positive and negative portions will be sampled as was explained above. Therefore, the difference between the offset voltage and the error signal is integrated by integrator 30 to cause VCO 34 to frequency sweep either towards or away from the correct lockup frequency. This is true since the sideband amplitude, and therefore the sampled error signal amplitude, is small compared to the offset signal amplitude, and hence cannot "override" the offset signal amplitude. Just before locking onto the correct carrier frequency, there is a large amplitude low frequency error signal compared to the amplitude of the offset signal due to the phase differences between the VCO 34 output signal and the carrier signal at input 10.

Again the difference between the error and offset signals is integrated, this time causing locking of VCO 34 onto the carrier frequency. Due to the characteristic of demodulator 18, once frequency locking is achieved, the error signal amplitude decreases as phase locking occurs until it equals the amplitude of the offset signal. Since amplifier 28 amplifies the voltage difference between its inputs, which difference is now zero, no more charge is supplied to capacitor 32. Capacitor 32 now holds a fixed charge, and thus supplies a fixed voltage to VCO 34. Therefore the frequency of VCO 34 is now a constant, i.e., that of the carrier frequency. Since the integrator 30 output level might be at one end of its range due to the offset voltage at its input, VCO 34 may not lock up. This problem can be overcome by reversing the phase of the offset as soon as one end of the integrator output range is reached. How this is accomplished, can be seen from the detailed circuit diagram in FIG. 2.

Figure 2:
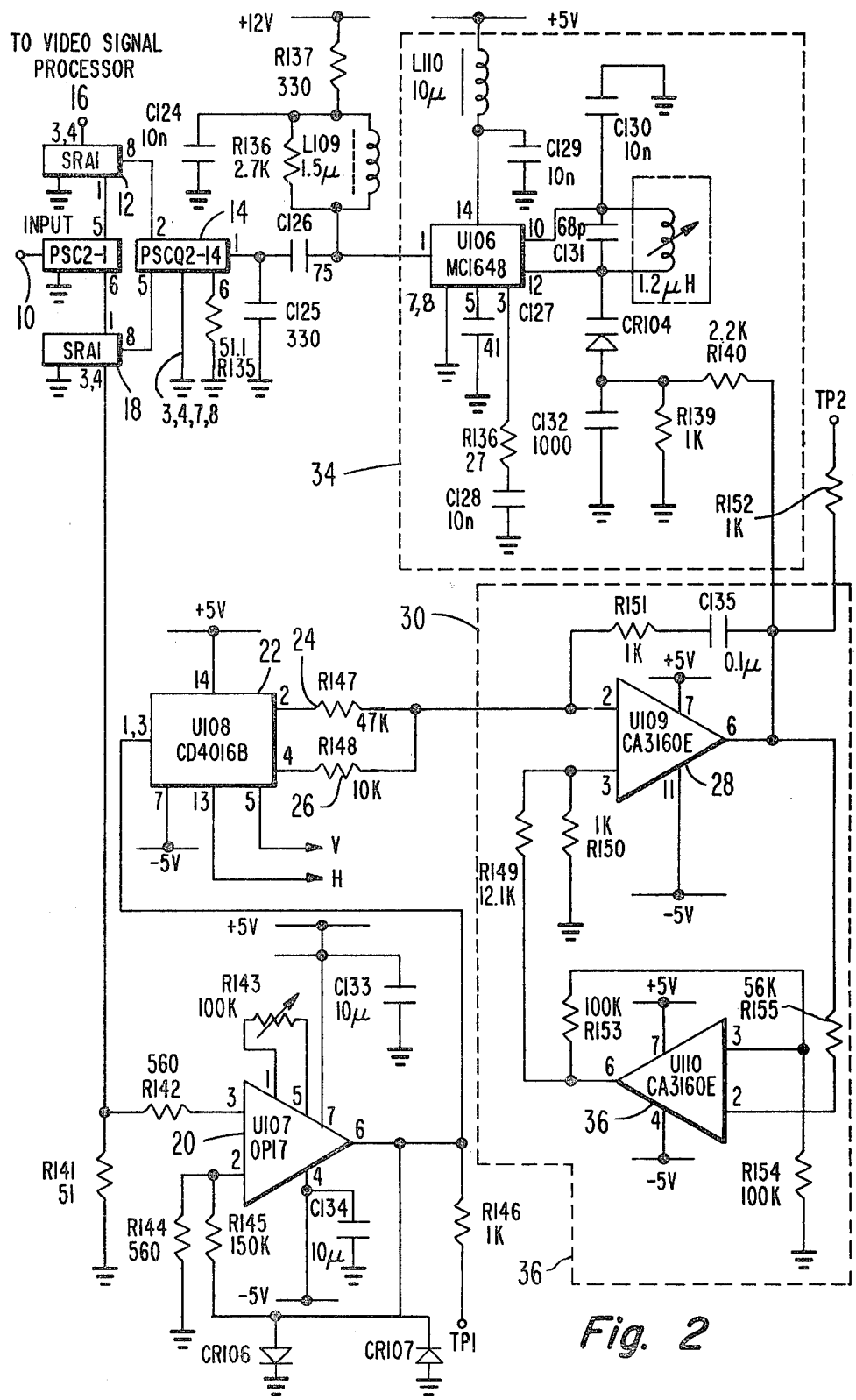
FIG. 2 shows a detailed circuit diagram of the embodiment of FIG. 1.

In FIG. 2, U108 is the sampler 22. The samples of the error signal during horizontal blanking periods appear at pin 2 and the samples during vertical blanking at pin 4. U109 is the operational amplifier 28, connected as an integrator 30 by capacitive feedback via C135 (32) and R151 (for stability reasons).

The integrator offset is introduced to the non-inverting input of U109, pin 3, and is generated by a Schmitt trigger U110 (36). Assuming a positive voltage offset at pin 3 of U109, the voltage at output pin 6 starts to rise (become more positive) until a threshold voltage level (the threshold level of U110, which equals one half of the supply voltage) established by R153 and R154 is reached. U110 then quickly changes state and a negative voltage offset is applied to U109. The integrator 30 output voltage then falls until the (changed) threshold is reached. The output of U109 therefore will be a triangle voltage waveform without an input reference signal. Assuming there is an input signal, VCO 34 will change its frequency in response to the output voltage from U109 until the incoming carrier frequency is reached. If search system 36 were not present, the error signal would now be zero. However, due to system 36, the error signal voltage will have equal amplitude and the same polarity with respect to the offset voltage, and the PLL will frequency lock. Since the output of integrator 30 is now constant, frequency sweeping by VCO 34 will stop.

In the embodiment of FIGS. 1 and 2 a small phase error between the signal from VCO 34 and the received input signal does exist because of the DC offset voltage introduced to lock VCO 34 under all conditions. Furthermore this offset can be positive or negative depending from which "side" the search control circuit locks VCO 34. This phase error causes a degradation of the frequency response (flatness) of the demodulated video signal from demodulator 12. The flatness error only is about 0.5 dB across a video bandwidth of 5 MHz, but unfortunately is different depending on the direction of the phase error. This may not be acceptable for certain applications.

Figure 3:
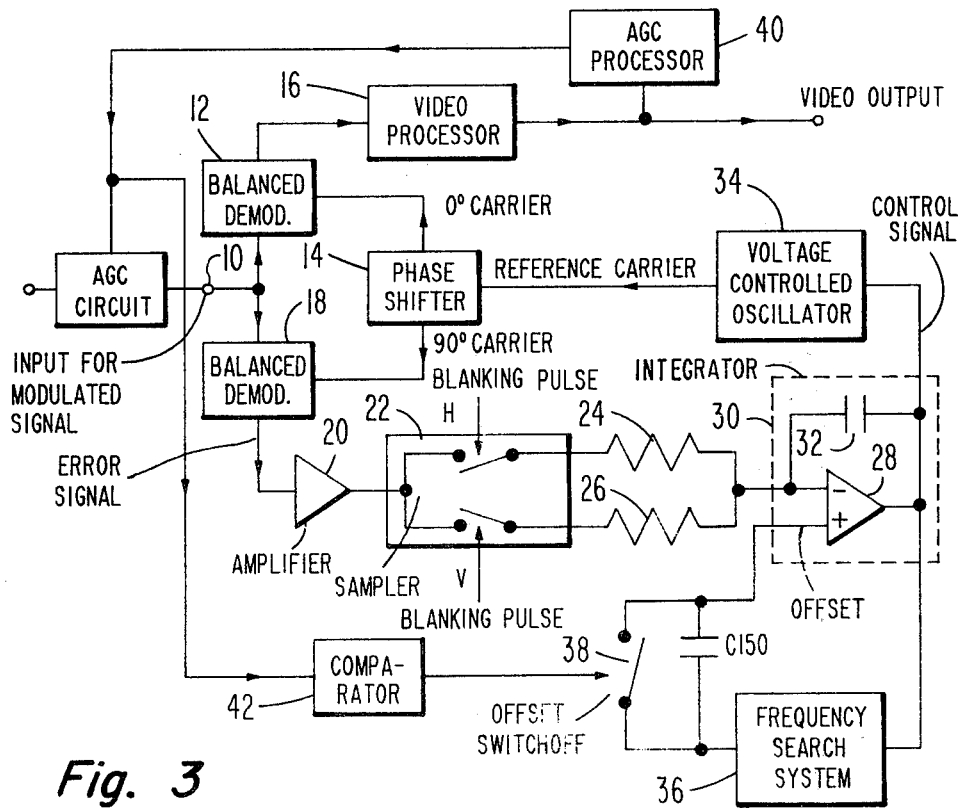
FIG. 3 shows a block diagram of a second embodiment of the invention.

It is therefore very desirable to switch off the offset voltage as soon as VCO 34 has been locked. Note that this offset only is used to ensure VCO locking. The solution shown in the embodiment of FIG. 3 is to include a comparator 42 and an analog gate shown as a switch 38 to disable the DC offset voltage as soon as VCO 34 has locked up. The control signal for analog gate 38 can be derived from automatic gain control processor 40. The AGC signal reaches its maximum value (e.g. 5 V) if VCO 34 is unlocked and reaches less than 4 V if VCO 34 is locked and if level 10 is correct. A Schmitt trigger comparator circuit 42 having a threshold level of approximately 4.5 V can therefore be used to switch analog gate 38.

Figure 4:
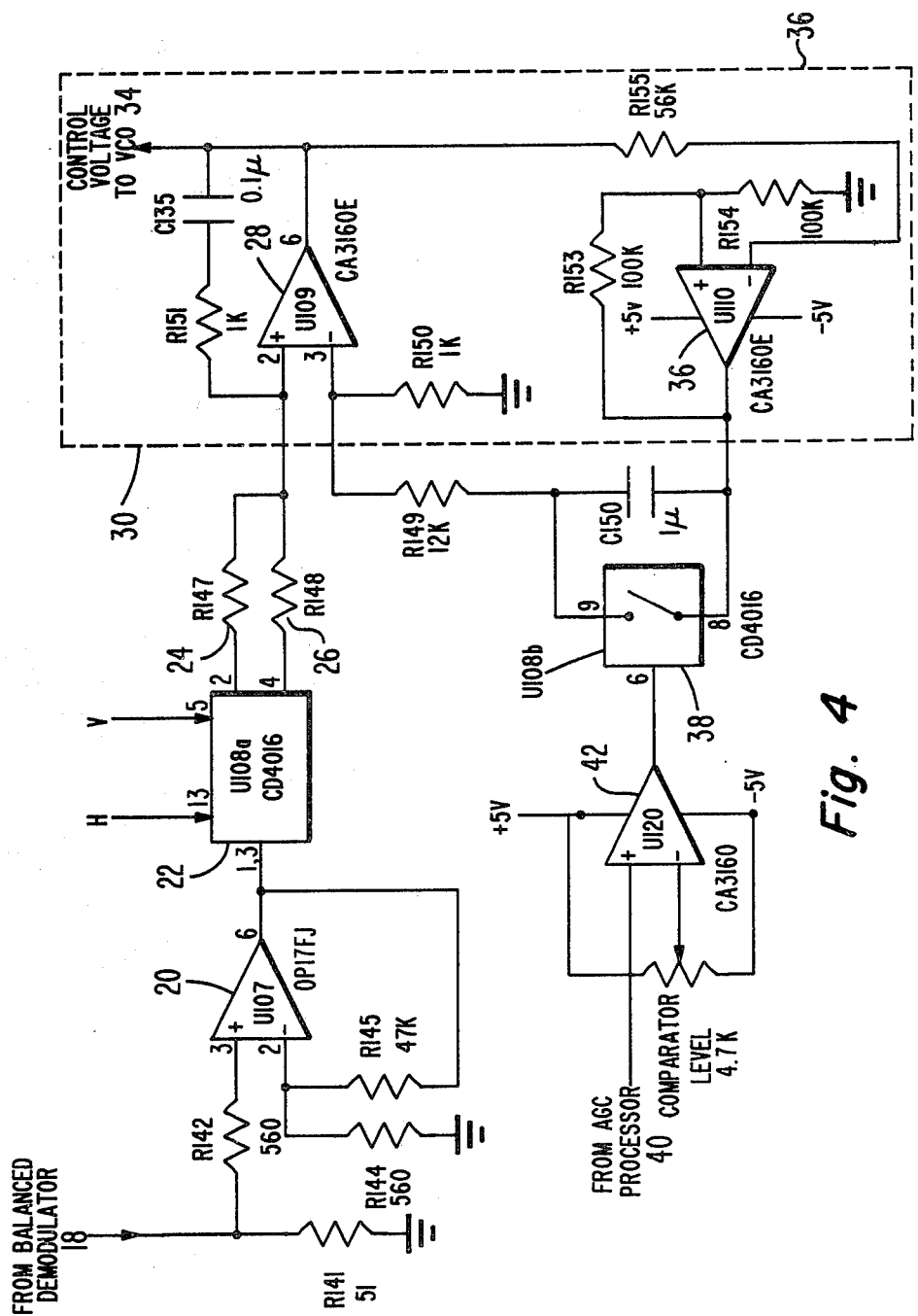
FIG. 4 shows a detailed circuit diagram of the embodiment of FIG. 3.

FIG. 4 shows a detailed circuit diagram of a portion of the embodiment of FIG. 3. The circuit is essentially the same as given in FIG. 2, with the exception of C150, U108b, and U120 which were added. If U108b is closed, the offset voltage is present at pin 3 of U109. If U108b is opened, the offset slowly disappears as C150 charges. As a result, the error signal at pin 2 of U109 follows the decrease in the offset voltage. Thus the phase error caused by the offset voltage disappears. Comparator U120 forms comparator circuit 42 which derives the switchoff criteria from the AGC voltage.

Note that C150 provides smooth switchoff of the offset voltage, otherwise the frequency of VCO 34 would jump and phase lock of the PLL might be lost.

What is claimed is:

1. An apparatus for locking a phase locked loop onto a modulated reference signal, said apparatus comprising deriving means for deriving from said reference signal a demodulated signal and an error signal; sampling means for sampling said error signal, avoiding means for avoiding lock ups of said loop on other than said reference signal, integrating means for integrating the sampled signal, said avoiding means comprising applying means for applying an offset signal to said integrating means, said applying means comprising ceasing means for ceasing to apply said offset signal once locking is achieved, said ceasing means comprising an automatic gain control processor coupled to said deriving means to receive said demodulated signal, a comparator having a pair of inputs respectively coupled to said processor and to a comparator reference signal source, and a switch controlled by said comparator and coupled between said applying means and said integrating means.

2. An apparatus as claimed in claim 1, wherein said integrating means has a relatively large time constant for high noise immunity.

3. An apparatus as claimed in claim 1, wherein said applying means comprises reversing means for reversing the polarity of said offset signal when a selected amplitude of the integrated signal is achieved.

4. An apparatus as claimed in claim 3, wherein said reversing means comprises a Schmitt trigger.

5. Apparatus for phase-lock-loop demodulating a double side-band suppressed-carrier signal modulated by a video signal, said apparatus comprising: means for producing an error signal from said suppressed-carrier signal including a voltage controlled oscillator, a phase shifter coupled to said oscillator for establishing first and second reference carriers in quadrature phase relationship, first and second balanced demodulators coupled respectively to said first and second reference carriers and each coupled to said suppressed-carrier signal for respectively providing a demodulated video signal and said error signal; means for sampling said error signal during the horizontal and vertical blanking intervals of said video signal; means for integrating the sampled error signal; means, coupled to said integrating means, for avoiding lock ups on other than said suppressed-carrier signal; and means for disabling said avoiding means upon achieving correct lock up; said disabling means comprising means for deriving an automatic gain control signal from said demodulated video signal, a comparator having a pair of inputs coupled to respectively receive said automatic gain control signal, and a selected reference signal, and a gate coupled to said comparator for control of said avoiding means.

6. Apparatus as claimed in claim 5, wherein said means for avoiding comprises a Schmitt trigger having a pair of threshold levels.

* * * * *